US007411454B1

(12) United States Patent
Chattin

(10) Patent No.: US 7,411,454 B1
(45) Date of Patent: Aug. 12, 2008

(54) ELECTRON TURBULENCE DAMPING CIRCUIT FOR A COMPLIMENTARY-SYMMETRY AMPLIFICATION UNIT

(76) Inventor: Daniel A. Chattin, 75 Perkins Hill Rd., Harwinton, CT (US) 06791

( * ) Notice: Subject to any disclaimer, the term of this patent is extended or adjusted under 35 U.S.C. 154(b) by 35 days.

(21) Appl. No.: 11/655,455

(22) Filed: Jan. 19, 2007

(51) Int. Cl.
*H03F 3/18* (2006.01)
(52) U.S. Cl. .................................. 330/263; 330/311
(58) Field of Classification Search ................. 330/263, 330/311, 310
See application file for complete search history.

(56) References Cited

U.S. PATENT DOCUMENTS

| 3,694,776 | A | * | 9/1972 | Linder ..................... 333/17.1 |
| 3,838,215 | A | | 9/1974 | Haynes, Jr. |
| 4,074,070 | A | | 2/1978 | Gaus |
| 4,475,233 | A | | 10/1984 | Watkins |
| 4,524,247 | A | | 6/1985 | Lindenberger et al. |
| 4,593,405 | A | | 6/1986 | Frye et al. |
| 4,597,100 | A | | 6/1986 | Grodinsky et al. |
| 4,928,048 | A | | 5/1990 | Doyle |
| 5,123,052 | A | | 6/1992 | Brisson |
| 5,636,284 | A | | 6/1997 | Pritchard |
| 5,754,667 | A | | 5/1998 | Nazar et al. |
| 6,771,781 | B2 | | 8/2004 | Chattin |
| 6,897,729 | B1 | * | 5/2005 | Jin et al. ..................... 330/296 |
| 6,914,488 | B2 | * | 7/2005 | Park et al. ................... 330/310 |
| 7,342,453 | B2 | * | 3/2008 | Amasuga et al. ........... 330/277 |

* cited by examiner

*Primary Examiner*—Henry K Choe
(74) *Attorney, Agent, or Firm*—Malcolm J. Chisholm, Jr.

(57) ABSTRACT

An electron turbulence damping circuit (40) for a complimentary-symmetry unit (10') includes a first output device (12') having a first conductivity and a second output device (14') having a second conductivity that is opposite the conductivity of the first output device (12'). A common load connector (28') is secured in electrical communication between a load (30'), a first current output (18') of the first output device (12') and a second current output (24') of the second output device (14'). First and second resistive elements (42, 46) are secured in parallel between current inputs (16', 22') of the output devices (12', 14') and the common load connector (28'). The first and second resistive elements have a virtually identical resistance value that is greater than ten times a minimum impedance of the load (30'). The output devices (12', 14') may be transistors.

12 Claims, 2 Drawing Sheets

ELECTRON TURBULENCE DAMPING CIRCUIT FOR A COMPLIMENTARY-SYMMETRY AMPLIFICATION UNIT

TECHNICAL FIELD

The present invention relates to electronic amplification systems and in particular relates to a circuit for damping electron turbulence that includes a complimentary-symmetry amplification units.

BACKGROUND OF THE INVENTION

It is well known that electronic amplification systems frequently utilize what is referred to as complimentary-symmetry functional units. Complimentary circuits were first described in U.S. Pat. No. 2,791,644 that issued on May 7, 1957 to Sziklai of RCA Laboratories. A complimentary-symmetry circuit may include one or more functional units referred to as complimentary-symmetry amplification units. In known amplification systems, it is common to have a plurality of complimentary-symmetry amplification units wired in series in what is known as "op amps", in order to minimize signal degradation. Each such complimentary-symmetry amplification unit typically includes first and second output devices, such as transistors, for low-power or high-power amplification of electrical currents in response to control voltages applied to the output units. The first and second output devices of a complimentary-symmetry unit are coordinated so that they have opposite conductivity.

For example and as shown in FIG. 1, a typical complimentary-symmetry unit 10 may include a first output device 12 and a second output device 14. The first output device 12 may be an amplification transistor known in the art. The device 12 includes a first current input 16, a first current output 18 and first control voltage input 20. The second output device 14 similarly includes a second current input 22, a second current output 24, and a second control voltage input 26. A common load connector 28 is secured in electrical communication with the first and second current outputs 18, 24 and with a load 30, such as an audio loudspeaker, which includes a ground or common return 32.

Such complimentary-symmetry units 10, are commonly used for in audio signal amplifiers and other similar types of circuits, such as audio, data, instrumentation, bi-polar output stage circuits (also referred to as "op-amps"), operational amplifiers, any bi-polar output applications, or servo-control circuits, etc. In audio amplification systems, the complimentary-symmetry amplification units essentially operate as a valve and interrupt and permit flow of electrons in amplifying the audio signal current with the control voltage. Usage of complimentary-symmetry amplification units is so widespread and commonly accepted that it is understood by those skilled in the art that such units work efficiently and need no modification. However, known electronic circuits that use complimentary-symmetry amplification units as sub-components of the circuits produce resulting output signals that are rarely precise replications of input signals that are amplified by the circuits. Accordingly, there is a need for an improvement to electronic circuits that use complimentary-symmetry amplification units so that a resulting amplified output signal more accurately replicates an input signal.

SUMMARY OF THE INVENTION

The invention is an electron turbulence damping circuit for a complimentary-symmetry amplification unit. The circuit includes a first output device for amplifying a current, wherein the device has a first conductivity, a first current input, a first current output, and a first control voltage input. The circuit also includes a second output device for amplifying a current, wherein the device has a second conductivity opposite the first conductivity of the first output device. The second output device also includes a second current input, a second current output, and a second control voltage input. The circuit also includes a common load connector secured in electrical communication between the first current output, the second current output and typically a load to a ground or to a common. A first resistive element is secured in electrical communication between the first current input and the common load connector, and a second resistive element secured in electrical communication between the second current input and the common load connector. The first resistive element has a resistance value that is virtually identical to a resistance value of the second resistive element, and the resistance value is greater than ten times a minimum impedance of the load, and may also be no greater than one-thousand times a minimum impedance of the load. In a preferred embodiment of electron turbulence damping circuit, the first and second resistance elements each have a resistance value that is between about fifty times and about five hundred times a minimum impedance of the load. (For purposes herein, the word "about" is to mean plus or minus twenty percent.) In another preferred embodiment, the first and second output devices are transistors.

It is theorized that use of complimentary-symmetry amplification units to effectively start and stop flow of electrons through the output devices in which the control voltage amplifies an input signal within the output device gives rise to what appears to be a turbulence in the flow of the electrons within an input signal current flowing through the output devices. Much like an interruption in the flow of water within a pipe by way of a sudden closing or opening of a valve on the pipe that results in "water hammer" and disturbance of laminar flow of water through the valve, use of complimentary-symmetry amplification units results in a severe disturbance of the flow of electrons through the units. For purposes herein, this disruption of the flow of electrons will be referred to as "electron turbulence".

It is the observation of the inventor of the present invention, that such electron turbulence is so commonplace as to be ignored by virtually all observers, or accepted as normal in audio system operations. In particular, within audio signal current amplification, such electron turbulence creates a background haze or smearing that obscures detail and clarity of a resulting audio sound. Such lack of detail and clarity may have been attributed by audio engineers to troublesome input signals and/or other known or unknown sources. However, experimentation by the inventor of the present invention has unequivocally demonstrated that converting a known prior art complimentary-symmetry amplification unit 10 to the described electron turbulence damping circuit eliminates the troublesome haze or smearing and lack of detail and clarity, resulting in audio reproduction of unparalleled accuracy. The present inventor urges that normal testing involves removal of the primary frequency. However, the above described "electron turbulence" is not observable by such procedures. The electron turbulence is a not a harmonic distortion. Instead, the electron turbulence is confined to the primary frequency and its effect is best observed when the electron turbulence is removed. It is considered that discovering the source of this lack of detail and clarity resulting from the complimentary-symmetry amplification unit generated electron turbulence is a significant component of the present invention.

The present invention dampens such electron turbulence that occurs during the on-off cycling of complimentary-symmetry output devices. The invention is applicable to any complimentary-symmetry output unit or stage having a common load connection and equal voltage drop across the output devices of the unit. The particular type of switching device or unit is not relevant. The complimentary-symmetry unit could include transistors as the output devices within the unit, mosfet devices, or as yet undeveloped devices. The electron damping circuit acts much like a pressure bleed in a water system. Experiments by the inventor have also established an optimal resistance value for the first and second resistive elements for high current applications of about 950 ohms, and for low current applications of 378 thousand ohms. While these are optimal values, they are only guidelines, and not limits.

It is to be understood that where the first and second output devices are characterized as having opposite conductivities, it is meant that a positive polarity of an input signal current is directed to the first current input of the first output device while simultaneously a negative polarity of the input signal current is directed to the second current input of the second output device.

In yet another preferred embodiment the electron damping circuit may also include a first emitter resistive element secured between the first current output and the common load connector, and a second emitter resistive element secured between the second current output and the common load connector. The first and second emitter resistive elements serve as current limiting components. The emitter resistive element embodiment can be used with the emitter resistive elements and the first and second output devices as a single unit which yields substantially reduced electron turbulence and enhanced results.

Accordingly, it is a general purpose of the present invention to provide an electron turbulence damping circuit for a complimentary-symmetry amplification unit that overcomes deficiencies of prior art complimentary-symmetry amplification units.

It is a more specific purpose to provide an electron damping circuit that minimizes electron turbulence produced by complimentary-symmetry amplification units.

These and other objects and advantages of this invention will become more readily apparent when the following description is read in conjunction with the accompanying drawings.

DESCRIPTION OF THE PREFERRED EMBODIMENTS

Figure 1:
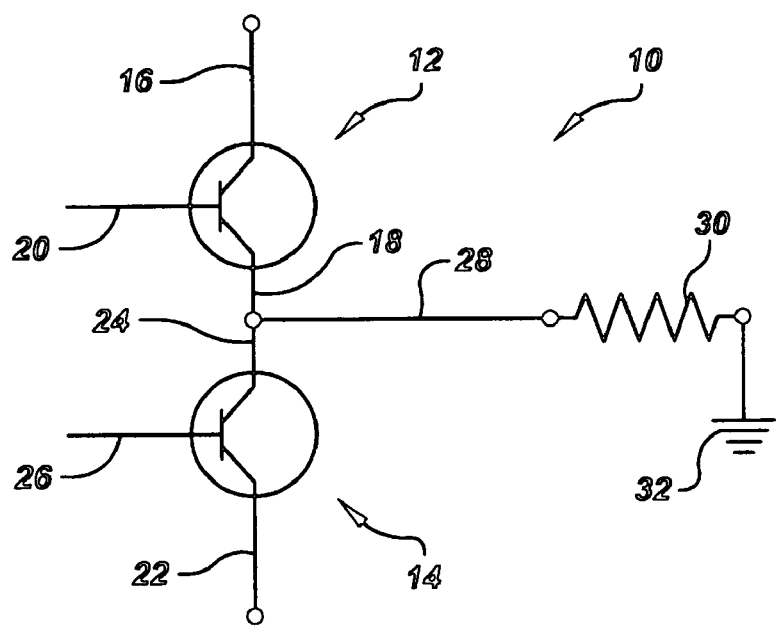
FIG. 1 is a schematic circuit diagram of a prior art embodiment of a complimentary-symmetry amplification unit.
Figure 2:
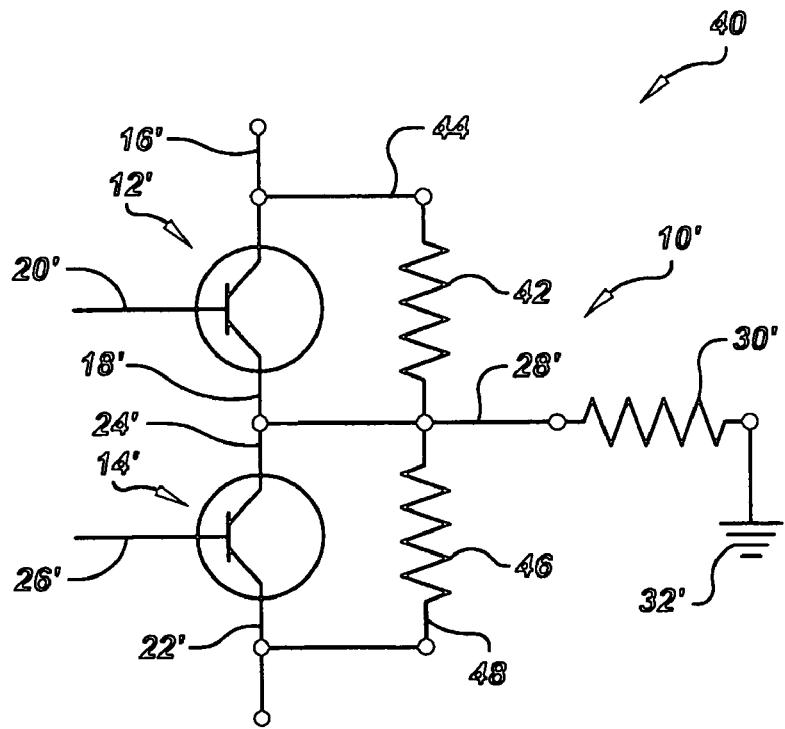
FIG. 2 is a schematic circuit diagram of an electron turbulence damping circuit for a complimentary-symmetry amplification unit constructed in accordance with the present invention.

Referring to the drawings in detail, an electron damping circuit 40 for a complimentary-symmetry amplification unit 10' is shown schematically in FIG. 2. The complimentary-symmetry amplification unit 10' of FIG. 2 is virtually the same as the prior art complimentary-symmetry amplification unit 10 as shown in FIG. 1. Components of the FIG. 2 unit 10' that are virtually the same as FIG. 1, unit 10 will be described in FIG. 2 as primes of the same reference numerals shown in FIG. 1. The FIG. 2. complimentary-symmetry amplification unit 10' includes a first output device 12' and a second output device 14'. The first output device 12' includes a first current input 16', a first current output 18' and first control voltage input 20'. The second output device 14' similarly includes a second current input 22', a second current output 24', and a second control voltage input 26'. A common load connector 28' is secured in electrical communication with the first and second current outputs 18', 24' and with a load 30', such as an audio loudspeaker, which includes a ground or common return 32'.

The electron turbulence damping circuit 40, also includes a first resistive element 42 secured in an electrical communication by wire 44 between the first current input 16' and the common load connector 28'. The circuit 40 as includes second resistive element 46 secured by line 48 between the second current input 22' and the common load connector 28'. The first resistive element 42 has a resistance value that is about the same as a resistance value of the second resistive element 46. (For purposes herein, the word "about" is to mean plus or minus five percent.) In a preferred embodiment, the first resistive element 42 has a resistance value that is virtually identical (meaning plus or minus two percent) to the resistance value of the second resistive element 46. The resistance value of each resistive element for 46, may be any value that is greater than ten times a minimum impedance of the load 30'. The resistance value of each resistive element for 46 may also be no greater than one-thousand times the minimum impedance of the load 30'. For example, if the load was a typical loud speaker of a modern audio amplification home "stereo" system having a minimum load impedance of 8 ohms, then the first resistive element 42 would have a resistance value of greater than 80 ohms and less than 8,000 ohms, and the second resistive element 46 would also have a resistive value of greater than 80 ohms and less than 8,000 ohms. In a preferred embodiment of electron turbulence damping circuit 40, the first and second resistive elements each have a resistance value that is between about fifty times and about five-hundred times the minimum impedance of the load 30'. As in the previous example if the minimum load impedance was 8 ohms, then the then first resistive element 42 would have a resistance value of greater than 400 ohms and no greater than 4,000 ohms, and the second resistive element 46 would have an identical resistance value of +greater than 400 ohms and no greater than 4,000 ohms.

It is stressed that the first and second resistive elements 42, 46 must have identical resistance values. Because the first and second resistive elements are secured in parallel with first and second current inputs 16', 22' and the common load connector 28', and because each have an identical resistance value, in accordance with "ohms law" the first and second resistive element produce zero voltage at the common load connector 28'. Therefore a balance of the circuit 40 is unaffected by current flow through the first and second resistive elements 42, 46. The resistive elements 42, 46 in parallel with the first and second output devices 12', 14' dampen a natural tendency for creation of the electron turbulence. The electron damping circuit 40 acts in much the same way as does a water-flow shut off diversion valve assembly. In such an assembly, where a large water pump (not shown) forces water through one-foot diameter or larger pipes, rather than using a gate valve to immediately terminate flow down stream of a pump, a diversion valve optionally directs water to flow away from a receiving system and instead into a diversion tank or a diversion loop around the pump. This avoids an enormous force impact of a sudden termination of flow of the water, such as for an emergency shut-down resulting from a leak within the receiving system. Similarly, the electron damping circuit 40, provides a diversionary route for current flow to minimize impact of sudden modifications of the current form.

The electron turbulence damping circuit may be effectively applied within a wide range of electronic applications. For example, experiments by the present inventor have established remarkable value in application of the circuit 40 within audio signal amplification systems for both a high current loud speaker output, and also for a low current signal op amp. For the high current loudspeaker output, the optimal resistance value of the first and second resistive elements 42, 46 is 950 ohms, plus or minus ten percent. For the low current signal op amp experimental circuit produced by the inventor, the optimal resistance value of the first and second resistive elements 42, 46 is 378 thousand ohms ("378 Kohms"), plus or minus ten percent.

In an preferred embodiment, the first and second output devices 12', 14' are transistors known in the art.

Figure 3:
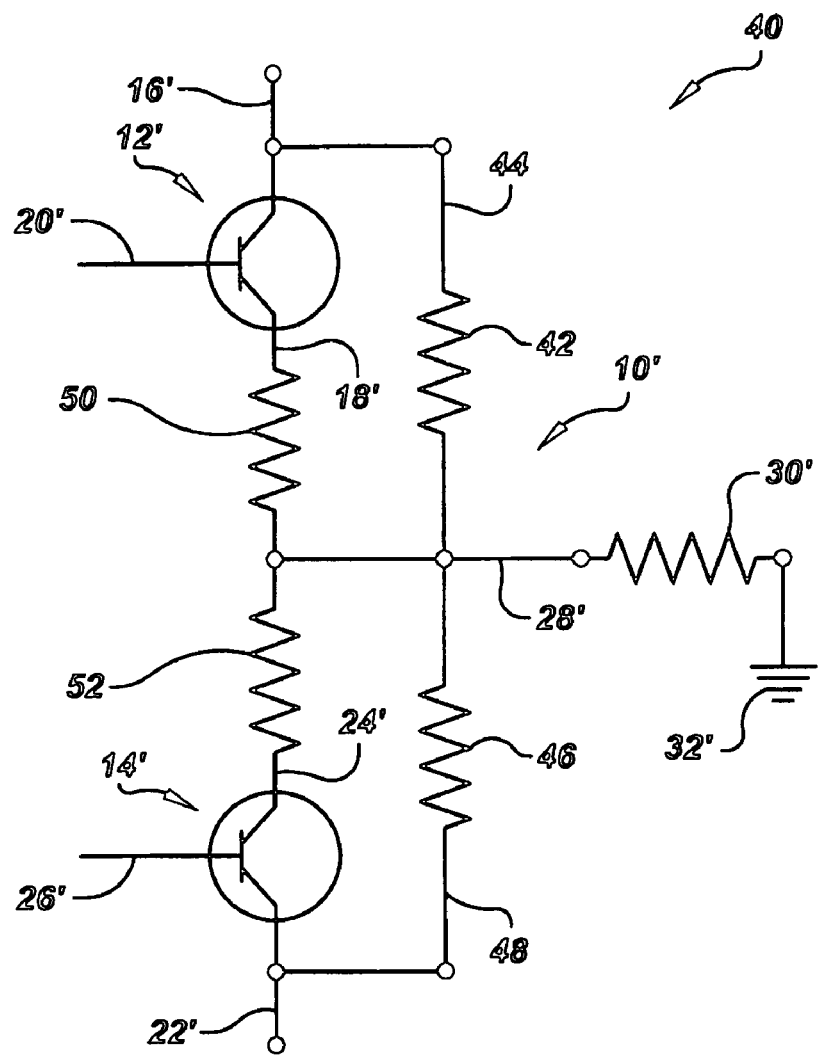
FIG. 3 is a schematic circuit diagram alternative embodiment of an electron turbulence damping circuit for a complimentary-symmetry amplification unit of the present invention.

FIG. 3 shows an embodiment of the electron damping circuit 40 that includes a first emitter resistive element 50 secured between the first current output 18' of the first output device 12' and the common load connector 28'. The FIG. 3 embodiment 40 also includes a second emitter resistive element 52 secured between the second current output 24' of the second output device 14' and the common load connector 28'. In the FIG. 3 embodiment 40, the first emitter resistive element 50 and the second emitter resistive element 52 have the same resistance values. The addition of the first and second emitter resistive elements 50, 52 with the first and second current output devices 12' 14', and first and second resistive elements 42, 46 as a single emitter resistive element electron turbulence damping circuit that yields substantially reduced electron turbulence and enhanced overall performance.

It is clear from the inventor's own experimentation that application of the present invention to audio amplification systems dramatically enhances the quality of an audio output signal. However, application of the invention within "op amps", which are frequently used in series in systems that amplify very low current signals, also significantly improves output signal quality. Therefore, the invention has potential to improve signal quality in a variety in non-audio electronic systems.

While the present invention has been described and illustrated with respect to particular descriptions and illustrations of preferred embodiments of the electron turbulence damping circuit 40, it should be understood that the invention is not limited to the described and illustrated examples. Accordingly, reference should be made primarily to the attached claims rather than to foregoing description to determine the scope of the invention.

What is claimed is:

1. An electron turbulence damping circuit (40) for a complimentary-symmetry unit (10'), the circuit (40) comprising:
   a. a first output device (12') for amplifying a current, the device having a first conductivity, a first current input (16'), a first current output (18'), and a first control voltage input (20');
   b. a second output device (14') for amplifying a current, the device having a second conductivity opposite of the first conductivity of the first output device (12'), a second current input (22'), a second current output (24'), and a second control voltage input (26');
   c. a common load connector (28') secured in electrical communication between the first current output (18'), the second current output (24') and a load (30');
   d. a first resistive element (42) secured in electrical communication between the first current input (16') and the common load connector (28');
   e. a second resistive element (46) secured in electrical communication between the second current input (22') and the common load connector (28'); and,
   f. wherein the first resistive element (44) has a resistance value that is about the same as a resistance value of the second resistive element (46), and the resistance value of the first and second resistive elements (44, 46) is greater than ten times a minimum load impedance of the load (30').

2. The electron turbulence damping circuit (40) of claim 1, wherein the resistance value of the first resistive element (42) is virtually identical to the resistive value of the second resistive element (46).

3. The electron turbulence damping circuit (40) of claim 1, wherein the first output device (12') comprises a transistor and the second output device (14') comprises a transistor.

4. The electron turbulence damping circuit (40) of claim 1, wherein the first resistance element (42) and the second resistive element (46) each have a resistance value that is between about fifty times and about five-hundred times the minimum impedance of the load 30'.

5. The electron turbulence damping circuit (40) of claim 1, wherein the first resistance element (42) and the second resistive element (46) each have a resistance value that is that is no greater than one thousand times the minimum load impedance of the load (30').

6. The electron turbulence damping circuit (40) of claim 1, further comprising a first emitter resistive element (50) secured in electrical communication between the first current output (18') of the first output device (12') and the common load connector (28') and a second emitter resistive element (52) secured in electrical communication between the second current output (24') of the second output device (14') and the common load connector (28'), wherein the first emitter resistive element (50) and the second emitter resistive element (52) have the about same resistance values.

7. An electron turbulence damping circuit (40) for a complimentary-symmetry unit (10'), the circuit (40) comprising:
   a. a first output device (12') for amplifying a current, the device having a first conductivity, a first current input (16'), a first current output (18'), and a first control voltage input (20');
   b. a second output device (14') for amplifying a current, the device having a second conductivity opposite of the first conductivity of the first output device (12'), a second current input (22'), a second current output (24'), and a second control voltage input (26');
   c. a common load connector (28') secured in electrical communication between the first current output (18'), the second current output (24') and a load (30');
   d. a first resistive element (42) secured in electrical communication between the first current input (16') and the common load connector (28');
   e. a second resistive element (46) secured in electrical communication between the second current input (22') and the common load connector (28'); and,
   f. wherein the first resistive element (44) has a resistance value that is about the same as a resistance value of the second resistive element (46), and the resistance value of the first and second resistive elements (44, 46) is about 950 ohms.

8. The electron turbulence damping circuit (40) of claim 7, wherein the first output device (12') comprises a transistor and the second output device (14') comprises a transistor.

9. The electron turbulence damping circuit (40) of claim 7, further comprising a first emitter resistive element (50) secured in electrical communication between the first current output (18') of the first output device (12') and the common load connector (28') and a second emitter resistive element (52) secured in electrical communication between the second current output (24') of the second output device (14') and the common load connector (28'), wherein the first emitter resistive element (50) and the second emitter resistive element (52) have the about same resistance values.

10. An electron turbulence damping circuit (40) for a complimentary-symmetry unit (10'), the circuit (40) comprising:
   a. a first output device (12') for amplifying a current, the device having a first conductivity, a first current input (16'), a first current output (18'), and a first control voltage input (20');
   b. a second output device (14') for amplifying a current, the device having a second conductivity opposite of the first conductivity of the first output device (12'), a second current input (22'), a second current output (24'), and a second control voltage input (26');
   c. a common load connector (28') secured in electrical communication between the first current output (18'), the second current output (24') and a load (30');
   d. a first resistive element (42) secured in electrical communication between the first current input (16') and the common load connector (28');
   e. a second resistive element (46) secured in electrical communication between the second current input (22') and the common load connector (28'); and,
   f. wherein the first resistive element (44) has a resistance value that is about the same as a resistance value of the second resistive element (46), and the resistance value of the first and second resistive elements (44, 46) is about 378 thousand ohms.

11. The electron turbulence damping circuit (40) of claim 10, wherein the first output device (12') comprises a transistor and the second output device (14') comprises a transistor.

12. The electron turbulence damping circuit (40) of claim 10, further comprising a first emitter resistive element (50) secured in electrical communication between the first current output (18') of the first output device (12') and the common load connector (28') and a second emitter resistive element (52) secured in electrical communication between the second current output (24') of the second output device (14') and the common load connector (28'), wherein the first emitter resistive element (50) and the second emitter resistive element (52) have the about same resistance values.

* * * * *